(12) United States Patent
Oh et al.

(10) Patent No.: US 12,472,541 B2
(45) Date of Patent: Nov. 18, 2025

(54) APPARATUS FOR CLEANING A BOWL AND A PHOTORESIST (PR) COATING SYSTEM INCLUDING THE SAME

(71) Applicant: Samsung Electronics Co., Ltd., Suwon-si (KR)

(72) Inventors: Kyoungwhan Oh, Hwaseong-si (KR); Jubong Lee, Hwaseong-si (KR); Ansook Sul, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 644 days.

(21) Appl. No.: 17/570,262

(22) Filed: Jan. 6, 2022

(65) Prior Publication Data
US 2022/0388043 A1 Dec. 8, 2022

(30) Foreign Application Priority Data
Jun. 7, 2021 (KR) .................. 10-2021-0073452

(51) Int. Cl.
| | |
|---|---|
| B08B 9/087 | (2006.01) |
| B08B 3/08 | (2006.01) |
| G03F 7/16 | (2006.01) |
| H01L 21/67 | (2006.01) |

(52) U.S. Cl.
CPC ............. *B08B 9/087* (2013.01); *B08B 3/08* (2013.01); *G03F 7/162* (2013.01); *H01L 21/67017* (2013.01)

(58) Field of Classification Search
CPC ............. G03F 7/162; H01L 21/67017–67051
See application file for complete search history.

(56) References Cited

U.S. PATENT DOCUMENTS

| | | | |
|---|---|---|---|
| 5,312,487 A | 5/1994 | Akimoto et al. | |
| 5,677,000 A | 10/1997 | Yoshioka et al. | |
| 6,432,199 B1 | 8/2002 | Takekuma | |
| 6,672,318 B1 * | 1/2004 | Tsuchiya | H01L 21/6715 269/21 |
| 9,508,567 B2 | 11/2016 | Namba | |
| 9,721,813 B2 | 8/2017 | Ogata et al. | |
| 9,919,350 B2 | 3/2018 | Tseng et al. | |
| 10,717,114 B2 | 7/2020 | Teng et al. | |
| 10,854,480 B2 | 12/2020 | Tanaka et al. | |

(Continued)

FOREIGN PATENT DOCUMENTS

| | | |
|---|---|---|
| JP | H0947709 A | 2/1997 |
| JP | 2005310941 A | 11/2005 |

(Continued)

OTHER PUBLICATIONS

Park (KR 100842018) text and translation (Year: 2008).*

*Primary Examiner* — Dah-Wei D. Yuan
*Assistant Examiner* — Stephen A Kitt
(74) *Attorney, Agent, or Firm* — Muir Patent Law, PLLC

(57) ABSTRACT

An apparatus for cleaning a bowl includes a base plate, and a blade coupled to the base plate. The blade extends in a curve on a surface of the base plate in a direction receding from a center of the base plate in a plan view. An inner side surface of the blade includes a curved surface concavely recessed toward an inside of the blade in a cross-sectional view taken along a direction perpendicular to an extending direction of the blade.

19 Claims, 16 Drawing Sheets

(56) References Cited

U.S. PATENT DOCUMENTS

| | | | |
|---|---|---|---|
| 2009/0032188 A1* | 2/2009 | Tsuchiya | H01L 21/67028 156/345.23 |
| 2014/0014134 A1* | 1/2014 | Ogata | B08B 13/00 134/104.1 |
| 2020/0070223 A1 | 3/2020 | Jeon et al. | |
| 2022/0075280 A1* | 3/2022 | Eum | B08B 9/0936 |

FOREIGN PATENT DOCUMENTS

| | | | | |
|---|---|---|---|---|
| JP | 2010016315 | A | | 1/2010 |
| JP | 6087765 | B2 | | 3/2017 |
| JP | 6503279 | B2 | | 4/2019 |
| KR | 200247772 | Y1 | | 10/2001 |
| KR | 200294306 | Y1 | | 11/2002 |
| KR | 200338668 | Y1 | | 1/2004 |
| KR | 200345810 | Y1 | | 3/2004 |
| KR | 200400321 | Y1 | | 11/2005 |
| KR | 100842018 | B1 * | 6/2008 | ....... H01L 21/67051 |
| KR | 100888654 | B1 | | 3/2009 |
| KR | 100892754 | B1 * | 4/2009 | ....... H01L 21/67051 |
| KR | 200444097 | Y1 | | 4/2009 |
| KR | 101223354 | B1 | | 1/2013 |
| KR | 200491268 | Y1 | | 3/2020 |
| KR | 20200049997 | A * | 5/2020 | ....... H01L 21/68764 |
| KR | 1020200048677 | A | | 5/2020 |
| KR | 102143914 | B1 | | 8/2020 |

* cited by examiner

APPARATUS FOR CLEANING A BOWL AND A PHOTORESIST (PR) COATING SYSTEM INCLUDING THE SAME

CROSS-REFERENCE TO RELATED APPLICATION

This U.S. non-provisional patent application claims priority under 35 U.S.C. § 119 to Korean Patent Application No. 10-2021-0073452, filed on Jun. 7, 2021, in the Korean Intellectual Property Office, the disclosure of which is hereby incorporated by reference in its entirety.

BACKGROUND

Embodiments of the inventive concepts relate to an apparatus for cleaning a bowl and a photoresist (PR) coating system including the same, and more particularly, to an apparatus for cleaning a bowl, which is capable of effectively cleaning a bowl in a PR coating system, and a PR coating system including the same.

A semiconductor device may be manufactured by various processes. For example, the semiconductor device may be manufactured by a photolithography process, an etching process, a deposition process, and a plating process. In the photolithography process for manufacturing the semiconductor device, a photoresist (PR) may be coated on a wafer. A PR coating system may be used to coat the photoresist on the wafer. The PR coating system may apply the PR on the wafer by using the principle that the PR is provided onto a rotating wafer to spread the PR on the wafer by centrifugal force. The PR coating system may include a bowl for collecting and exhausting the PR flying to the outside of the wafer.

SUMMARY

Embodiments of the inventive concepts may provide an apparatus for cleaning a bowl, which is capable of effectively cleaning a bowl, and a photoresist (PR) coating system including the same.

Embodiments of the inventive concepts may also provide an apparatus for cleaning a bowl, which is capable of increasing a replacement period of a bowl, and a PR coating system including the same.

Embodiments of the inventive concepts may also provide an apparatus for cleaning a bowl, which is capable of cleaning a bowl by various methods, and a PR coating system including the same.

In an aspect, an apparatus for cleaning a bowl may include a base plate, and a blade coupled to the base plate. The blade may extend in a curve on a surface of the base plate in a direction receding from a center of the base plate in a plan view. An inner side surface of the blade may include a curved surface concavely recessed toward an inside of the blade in a cross-sectional view taken along a direction perpendicular to an extending direction of the blade.

In an aspect, a photoresist (PR) coating system may include a bowl having a ring shape, a spin chuck located inside the bowl and configured to rotate about an axis parallel to a first direction, a bowl cleaning apparatus configured to be disposed on the spin chuck and configured to be rotated by the spin chuck, and a cleaning solution spraying apparatus configured to spray a cleaning solution toward the bowl cleaning apparatus. The bowl cleaning apparatus may include a base plate having a central axis parallel to the first direction when the bowl cleaning apparatus is disposed on the spin chuck, and a blade extending in a radial direction of the base plate on a surface of the base plate. One side surface of the blade may include a curved surface concavely recessed toward an inside of the blade in a cross-sectional view taken along a direction perpendicular to an extending direction of the blade.

In an aspect, an apparatus for cleaning a bowl may include a base plate having a disk shape, and a plurality of blades coupled to the base plate. Each of the plurality of blades may extend in a curve on a surface of the base plate from a position spaced apart from a central axis of the base plate by a first distance to a position spaced apart from the central axis by a second distance greater than the first distance in a plan view. The plurality of blades may be spaced apart from each other in a circumferential direction of the base plate.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
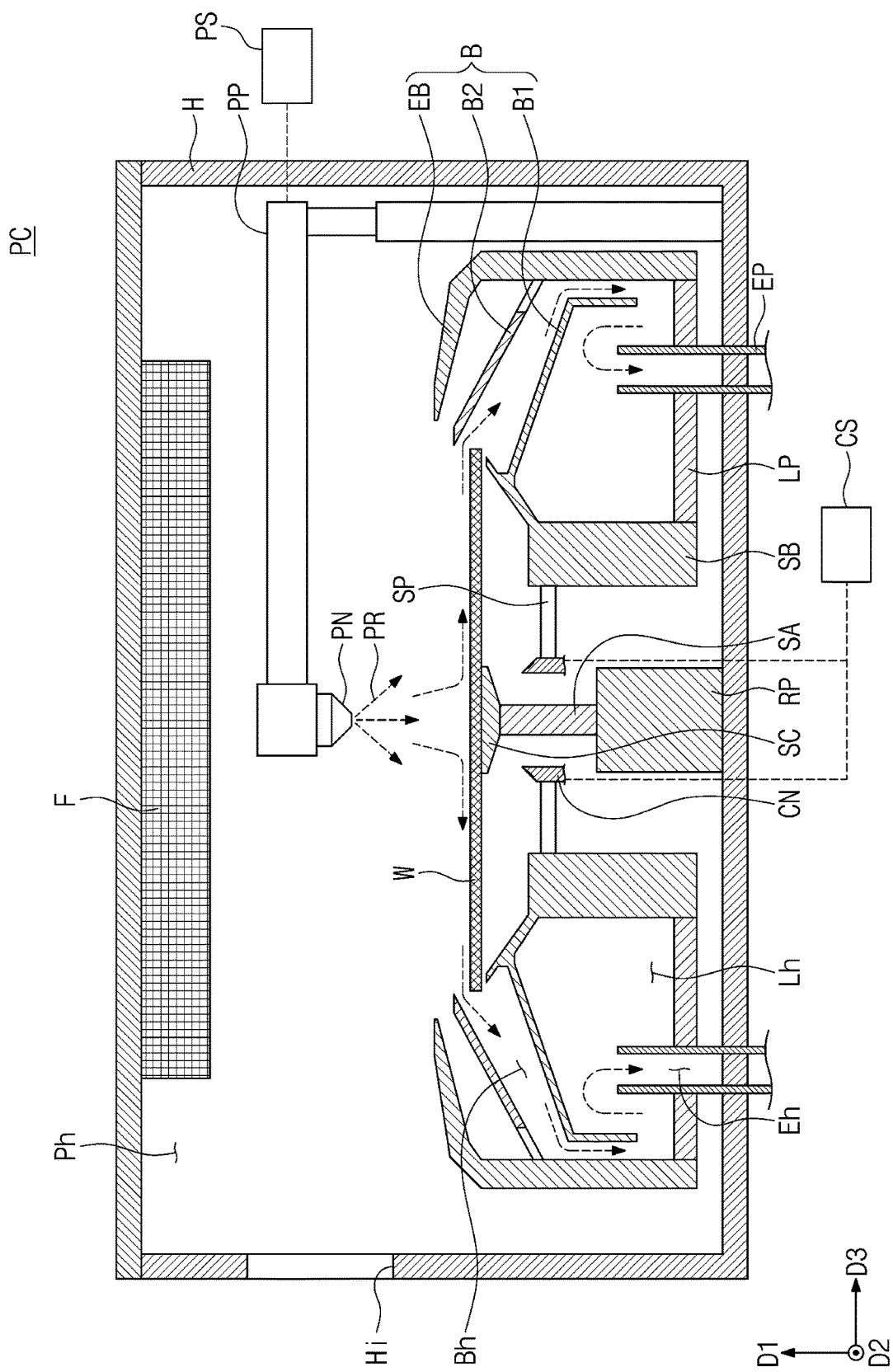
FIG. 1 is a cross-sectional view illustrating a state in which a wafer is disposed in a photoresist (PR) coating system according to some embodiments of the inventive concepts.

Hereinafter, embodiments of the inventive concepts will be described in detail with reference to the accompanying drawings. The same reference numerals or the same reference designators may denote the same elements or components throughout the specification.

FIG. 1 is a cross-sectional view illustrating a state in which a wafer is disposed in a photoresist (PR) coating system according to some embodiments of the inventive concepts.

Hereinafter, a reference designator 'D1' of FIG. 1 may be referred to as a first direction, and a reference designator 'D2' intersecting the first direction D1 in FIG. 1 may be referred to as a second direction. A reference designator 'D3' intersecting the first and second directions D1 and D2 in FIG. 1 may be referred to as a third direction. The first direction D1, the second direction D2 and the third direction D3 may be perpendicular to each other. The first direction D1 may be referred to as a vertical direction. Alternatively, the first direction D1 may be referred to as an upward direction, and a direction opposite to the first direction D1 may be referred to as a downward direction. Each of the second direction D2 and the third direction D3 may be referred to as a horizontal direction.

Spatially relative terms, such as "vertical," "horizontal," "upward," "downward," "beneath," "below," "lower," "above," "upper" and the like, may be used herein for ease of description to describe positional relationships. It will be understood that the spatially relative terms encompass different orientations of the device in addition to the orientation depicted in the figures.

Referring to FIG. 1, a PR coating system PC may be provided. The PR coating system PC may perform a coating process by using a photoresist PR. For example, the PR coating system PC may be an apparatus for coating a top surface of a wafer W with the photoresist PR. The photoresist PR may be a liquid material including a photosensitive material. The PR coating system PC may include a housing H, a filter F, a rotation driving unit RP, a rotation shaft SA, a spin chuck SC, a support member SB, a lower support plate LP, a bowl B, an exhaust part EP, a PR supply unit PS, a PR transfer unit PP, a PR nozzle PN, a cleaning solution supply unit CS, a cleaning solution spraying apparatus CN, a connection member SP, and an apparatus A for cleaning a bowl (hereinafter, referred to as a bowl cleaning apparatus A; see FIG. 2).

The housing H may provide a process space Ph. The spin chuck SC, the bowl B, the PR nozzle PN, the cleaning solution spraying apparatus CN, etc. may be disposed in the process space Ph. A PR coating process may be performed on the wafer W in the housing H. After a PR coating process is performed, a cleaning process may be performed on the bowl B in the housing H. The housing H may further provide an inlet Hi. The inlet Hi may connect the process space Ph and an outside space. The wafer W and/or the bowl cleaning apparatus A may enter the process space Ph through the inlet Hi. For example, the wafer W and/or the bowl cleaning apparatus A may be disposed on the spin chuck SC through the inlet Hi by using a transfer unit (not shown). The transfer unit may include or may be a robot arm. The robot arm may come in contact with a bottom surface of the wafer W and/or a bottom surface of the bowl cleaning apparatus A to transfer the wafer W and/or the bowl cleaning apparatus A. However, embodiments of the inventive concepts are not limited thereto. The transfer unit may include another type transfer apparatus.

The filter F may be located in an upper portion of the process space Ph. For example, the filter F may be coupled to a ceiling of the housing H. The filter F may absorb dust in the process space Ph.

The rotation driving unit RP may support the rotation shaft SA. The rotation driving unit RP may rotate the rotation shaft SA and the spin chuck SC. The spin chuck SC may be rotated by the rotation driving unit RP.

The rotation shaft SA may connect the rotation driving unit RP and the spin chuck SC. The rotation shaft SA may extend in the first direction D1. The rotation driving force of the rotation driving unit RP may be transmitted to the spin chuck SC by the rotation shaft SA.

The spin chuck SC may be located on the rotation shaft SA. The spin chuck SC may be rotated by the rotation driving unit RP. For example, the spin chuck SC may rotate about an axis parallel to the first direction D1. The spin chuck SC may support the wafer W and/or the bowl cleaning apparatus A. For example, the spin chuck SC may support the wafer W and/or the bowl cleaning apparatus A by using vacuum pressure. The spin chuck SC may rotate the wafer W and/or the bowl cleaning apparatus A.

The support member SB may be located outside the rotation shaft SA. The support member SB may support the bowl B and the cleaning solution spraying apparatus CN. The lower support plate LP may be connected to the support member SB.

The bowl B may be located outside the spin chuck SC. For example, the bowl B may be spaced outwardly from the spin chuck SC and may surround the spin chuck SC. Thus, the spin chuck SC may be located inside the bowl B. The bowl B may have a rotating body shape. For example, the bowl B may have a ring shape. For example, the bowl B may be a part receiving flying out photoresist PR from the edge of the wafer W while the wafer W is coated with the photoresist PR. For example, a portion of the bowl B may be placed to surround edge of the wafer W, and another portion of the bowl B may be placed below the edge of the wafer W. However, embodiments of the inventive concepts are not limited thereto. The bowl B may include a first bowl B1, a second bowl B2, and an outer bowl EB. For example, the first bowl B1, the second bowl B2 and the outer bowl EB may be parts of the bowl B. The first bowl B1 may be located below the wafer W and/or the bowl cleaning apparatus A (see FIG. 2) disposed on the spin chuck SC. For example, the vertical level of the first bowl B1 may be lower than the vertical level of a top surface of the spin chuck SC. The first bowl B1 may be supported by the support member SB. The second bowl B2 may be spaced outwardly from the first bowl B1. The second bowl B2 may surround the first bowl B1. A bottom surface of the second bowl B2 may face a top surface of the first bowl B1. A bowl path Bh may be provided between the top surface of the first bowl B1 and the bottom surface of the second bowl B2. The bowl path Bh may be a path along which a liquid (e.g., a photoresist, a cleaning solution, etc.) flows. The outer bowl EB may be disposed outside the second bowl B2 and may surround the second bowl B2.

The exhaust part EP may penetrate the lower support plate LP. The exhaust part EP may provide an exhaust path Eh. The exhaust path Eh may be connected to the bowl path Bh.

The photoresist PR and a cleaning solution CL (see FIG. 10) may be exhausted to the outside of the housing H through the exhaust path Eh.

The PR supply unit PS may supply the photoresist PR to the PR nozzle PN. The photoresist PR supplied from the PR supply unit PS may be supplied onto the wafer W through the PR nozzle PN. The PR supply unit PS may be located outside the housing H. However, embodiments of the inventive concepts are not limited thereto. The PR transfer unit PP may connect the PR supply unit PS to the PR nozzle PN. The photoresist PR may move to the PR nozzle PN through the PR transfer unit PP.

The PR nozzle PN may be spaced apart upwardly from the spin chuck SC. For example, the PR nozzle PN may be spaced apart upwardly from a center of the spin chuck SC by a certain distance. The PR nozzle PN may provide or dispense the photoresist PR toward/to the wafer W.

The cleaning solution supply unit CS may supply a cleaning solution to the cleaning solution spraying apparatus CN. The cleaning solution supply unit CS may be located outside the housing H. However, embodiments of the inventive concepts are not limited thereto.

The cleaning solution spraying apparatus CN may spray the cleaning solution in the housing H. For example, the cleaning solution supplied from the cleaning solution supply unit CS may be sprayed to the bowl cleaning apparatus A (see FIG. 2) disposed on the spin chuck SC through the cleaning solution spraying apparatus CN. The cleaning solution may be a liquid capable of cleaning a surface of the bowl B. For example, the cleaning solution may include deionized (DI) water and/or thinner (a diluent including an organic solvent such as benzene, xylene, toluene, or acetone). However, embodiments of the inventive concepts are not limited thereto. The cleaning solution may include or be formed of another material capable of cleaning the surface of the bowl B. An outlet of the cleaning solution spraying apparatus CN may face a surface of the bowl cleaning apparatus A disposed on the spin chuck SC. For example, the cleaning solution spraying apparatus CN may be located under the spin chuck SC, as illustrated in FIG. 1. In the case in which the cleaning solution spraying apparatus CN is located under the spin chuck SC, the cleaning solution may be sprayed to a bottom surface of the bowl cleaning apparatus A (see FIG. 2). For example, the cleaning solution spraying apparatus CN may be fixed by the support member SB. Alternatively, the cleaning solution spraying apparatus CN may spray the cleaning solution to a top surface of the bowl cleaning apparatus A. This will be described later in more detail.

The connection member SP may support the cleaning solution spraying apparatus CN. For example, the connection member SP may fix the cleaning solution spraying apparatus CN to the support member SB.

The bowl cleaning apparatus A may be disposed on the spin chuck SC. For example, the bowl cleaning apparatus A may be disposed on the spin chuck SC on which the wafer W is not disposed. For example, the bowl cleaning apparatus A or the wafer W may be selectively disposed on the spin chuck SC. The bowl B may be cleaned using the bowl cleaning apparatus A. This will be described later in more detail.

The photoresist PR supplied from the PR supply unit PS may be provided or dispensed onto the wafer W by the PR nozzle PN. The wafer W may be rotated by the spin chuck SC. Thus, the photoresist PR provided on the wafer W may move toward the edge/outside of the wafer W by centrifugal force. In this process, the photoresist PR may be evenly coated on the wafer W. The photoresist PR remaining after being coated on the wafer W may fly or sprinkle outward beyond an edge of the wafer W. The flying photoresist PR may be collected at certain positions by the bowl B. For example, the photoresist PR may flow down along the bottom surface of the second bowl B2 and the top surface of the first bowl B1. For example, the photoresist PR may move through the bowl path Bh. The photoresist PR passing through the bowl path Bh may be exhausted to the outside through the exhaust path Eh. For example, the photoresist PR passing through the bowl path Bh may be gathered on the lower support plate LP and may flow over to the exhaust path Eh. A portion of the photoresist PR may remain on the bottom surface of the second bowl B2 and the top surface of the first bowl B1. When the photoresist PR has a high viscosity, a larger amount of the photoresist PR may remain on the bottom surface of the second bowl B2 and the top surface of the first bowl B1.

Figure 2:
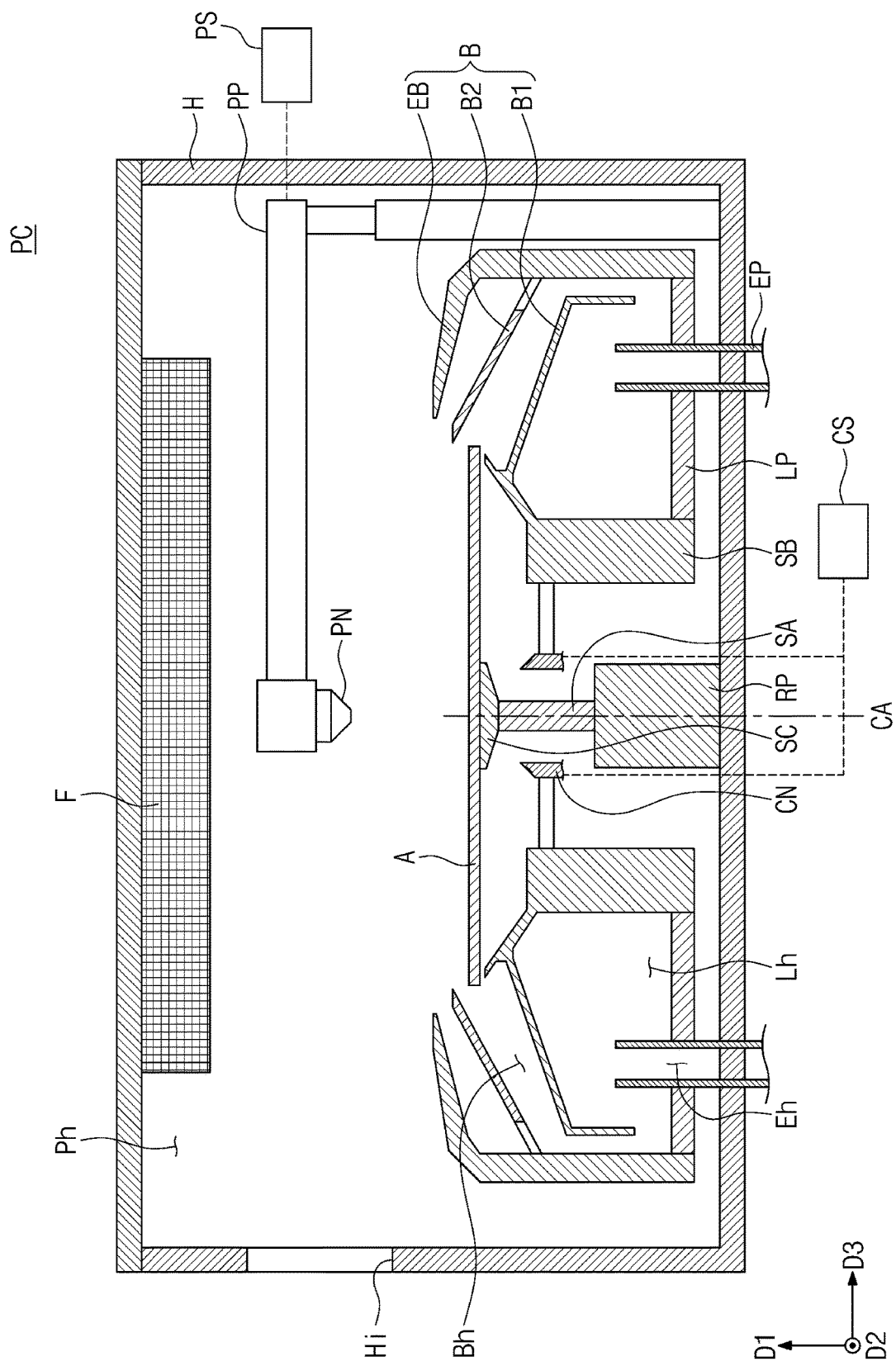
FIG. 2 is a cross-sectional view illustrating a PR coating system according to some embodiments of the inventive concepts.

FIG. 2 is a cross-sectional view illustrating a PR coating system according to some embodiments of the inventive concepts.

Referring to FIG. 2, the wafer W (see FIG. 1) disposed on the spin chuck SC may be removed. For example, the transfer unit may transfer the wafer W through the inlet Hi to unload the wafer W from the spin chuck SC and move the wafer W to the outside of the housing H.

As described above, the photoresist PR (see FIG. 1) may remain on the bowl B. Thus, it may be required to remove the photoresist PR on the bowl B after performing the coating process. To clean the bowl B, the bowl cleaning apparatus A may be disposed on the spin chuck SC. For example, the transfer unit may transfer the bowl cleaning apparatus A through the inlet Hi to dispose the bowl cleaning apparatus A on the spin chuck SC.

Figure 3:
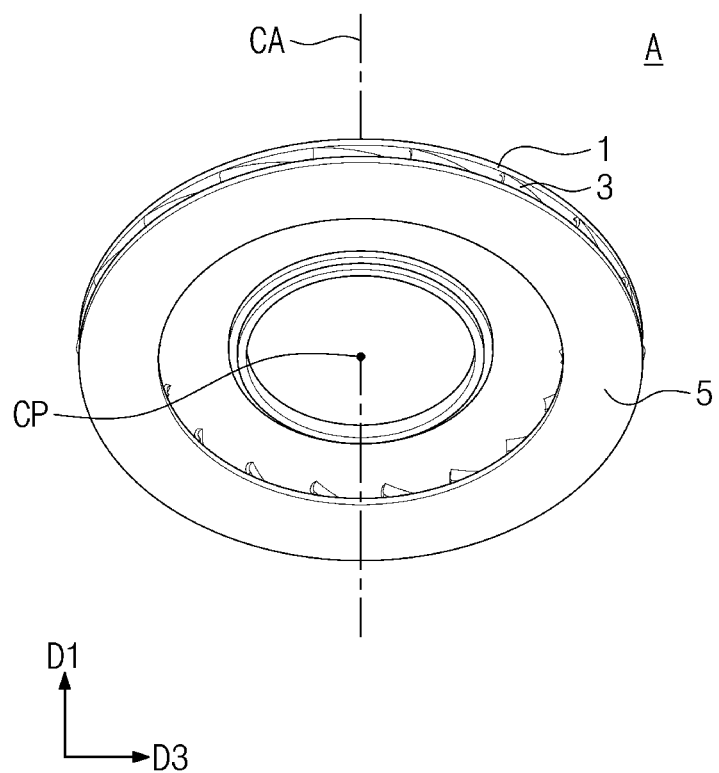
FIG. 3 is a perspective view illustrating an apparatus for cleaning a bowl, according to some embodiments of the inventive concepts.
Figure 4:
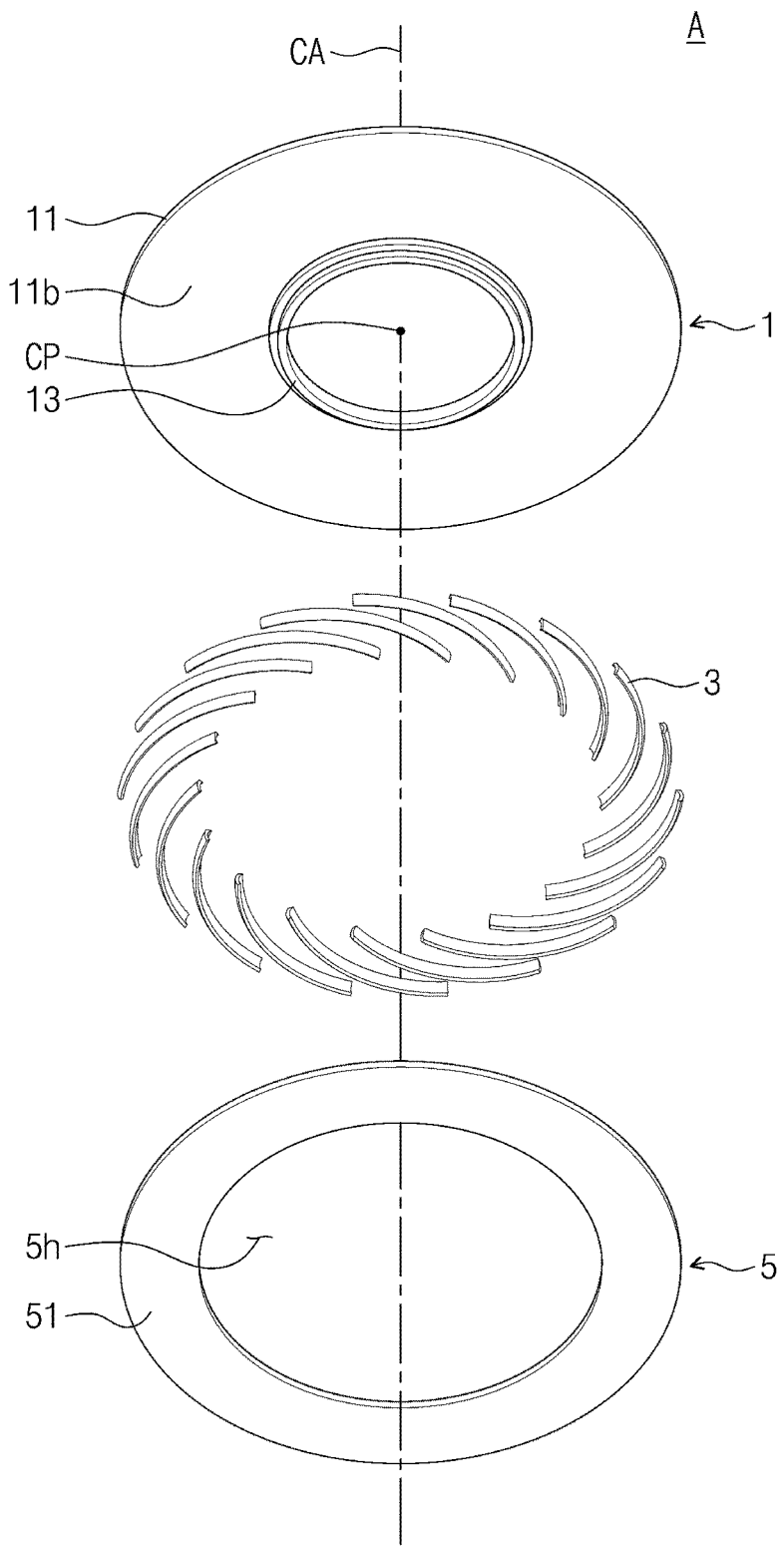
FIG. 4 is an exploded perspective view illustrating an apparatus for cleaning a bowl, according to some embodiments of the inventive concepts.
Figure 5:
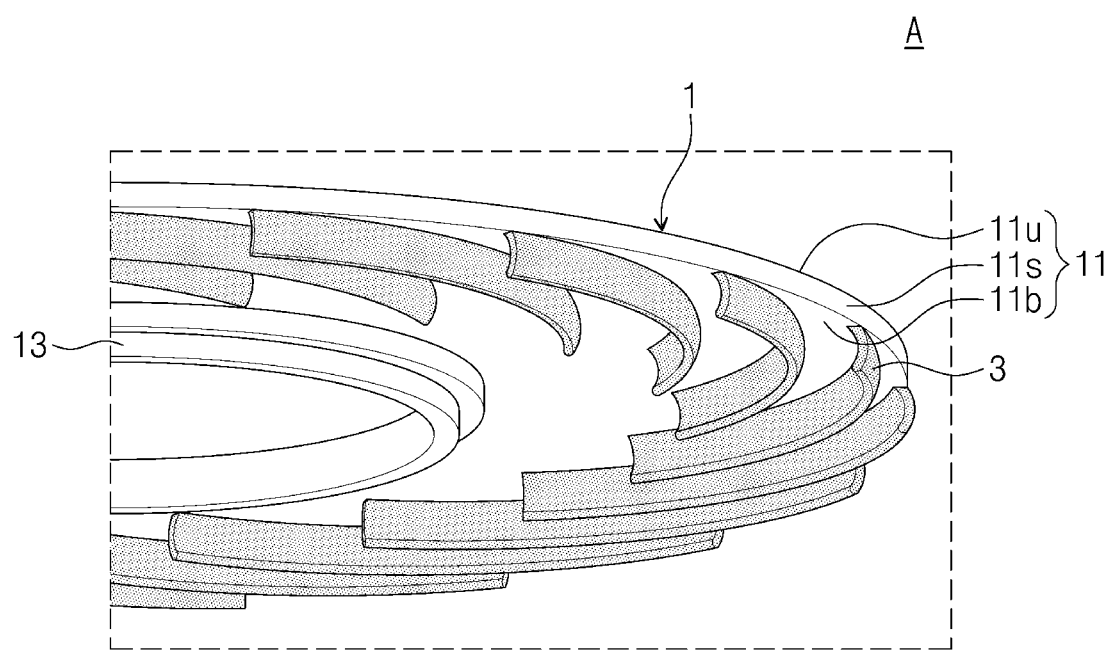
FIG. 5 is a perspective view illustrating a portion of an apparatus for cleaning a bowl, according to some embodiments of the inventive concepts.

FIG. 3 is a perspective view illustrating an apparatus for cleaning a bowl, according to some embodiments of the inventive concepts, FIG. 4 is an exploded perspective view illustrating an apparatus for cleaning a bowl, according to some embodiments of the inventive concepts, and FIG. 5 is a perspective view illustrating a portion of an apparatus for cleaning a bowl, according to some embodiments of the inventive concepts.

Referring to FIGS. 3, 4 and 5, the bowl cleaning apparatus A may include a base plate 1, a blade 3, and a lower plate 5.

The base plate 1 may have a shape of a solid that revolves. For example, the base plate 1 may have a shape of a solid that revolves based on a central axis CA as an axis of revolution. For example, the base plate 1 may have a disk shape, e.g., a round flat plate. The base plate 1 may include a top surface $11u$, a bottom surface $11b$, and a side surface $11s$. The top surface $11u$ and the bottom surface $11b$ may be vertically spaced apart from each other. The side surface $11s$ may connect the top surface $11u$ and the bottom surface $11b$. The central axis CA of the base plate 1 may be parallel to the first direction D1. The central axis CA may pass through a center CP of the base plate 1. The base plate 1 may support the blade 3. A diameter of the base plate 1 may be substantially equal or similar to a diameter of the wafer W (see FIG. 1). The base plate 1 may include or be formed of a material having chemical resistance to the cleaning solution. For example, the base plate 1 may include or be formed of a resin-based material such as perfluoroalkoxy (PFA) and/or polytetrafluoroethylene (PTFE). The base plate 1 may include a support region 13 and a guide region 11. The support region 13 may be an inner region. For example, the support region 13 may be a region through which the central axis CA passes. In some embodiments, a bottom surface of the support region 13 may protrude downward. The transfer unit may come in contact with the bottom surface of the support region 13 to move the bowl cleaning apparatus A. The guide region 11 may be disposed outside the support region 13. The guide region 11 may surround the support region 13 when viewed in a plan view.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The blade 3 may be coupled to a surface of the base plate 1. For example, the blade 3 may be coupled to the bottom surface 11b of the base plate 1. For example, the blade 3 may be attached on and/or contact the bottom surface 11b of the base plate 1. For example, the blade 3 may be coupled to the bottom surface 11b of the guide region 11. For example, the blade 3 may not be located under the support region 13. The blade 3 will be described later in more detail.

The lower plate 5 may be coupled to a bottom of the blade 3. For example, the lower plate 5 may be attached on and/or contact the bottom of the blade 3. The lower plate 5 may be vertically spaced apart from the base plate 1. For example, a top surface of the lower plate 5 may be spaced apart downwardly from the bottom surface 11b of the base plate 1. For example, the lower plate 5 may be coupled to bottoms of a plurality of blades 3. The lower plate 5 may have a ring shape. For example, a body 51 of the lower plate 5 may provide a lower hole 5h. A diameter of the lower plate 5 may be substantially equal or similar to the diameter of the base plate 1. The lower plate 5 may include or be formed of a material having chemical resistance to the cleaning solution. For example, the lower plate 5 may include or be formed of a resin-based material such as perfluoroalkoxy (PFA) and/or polytetrafluoroethylene (PTFE).

Figure 6:
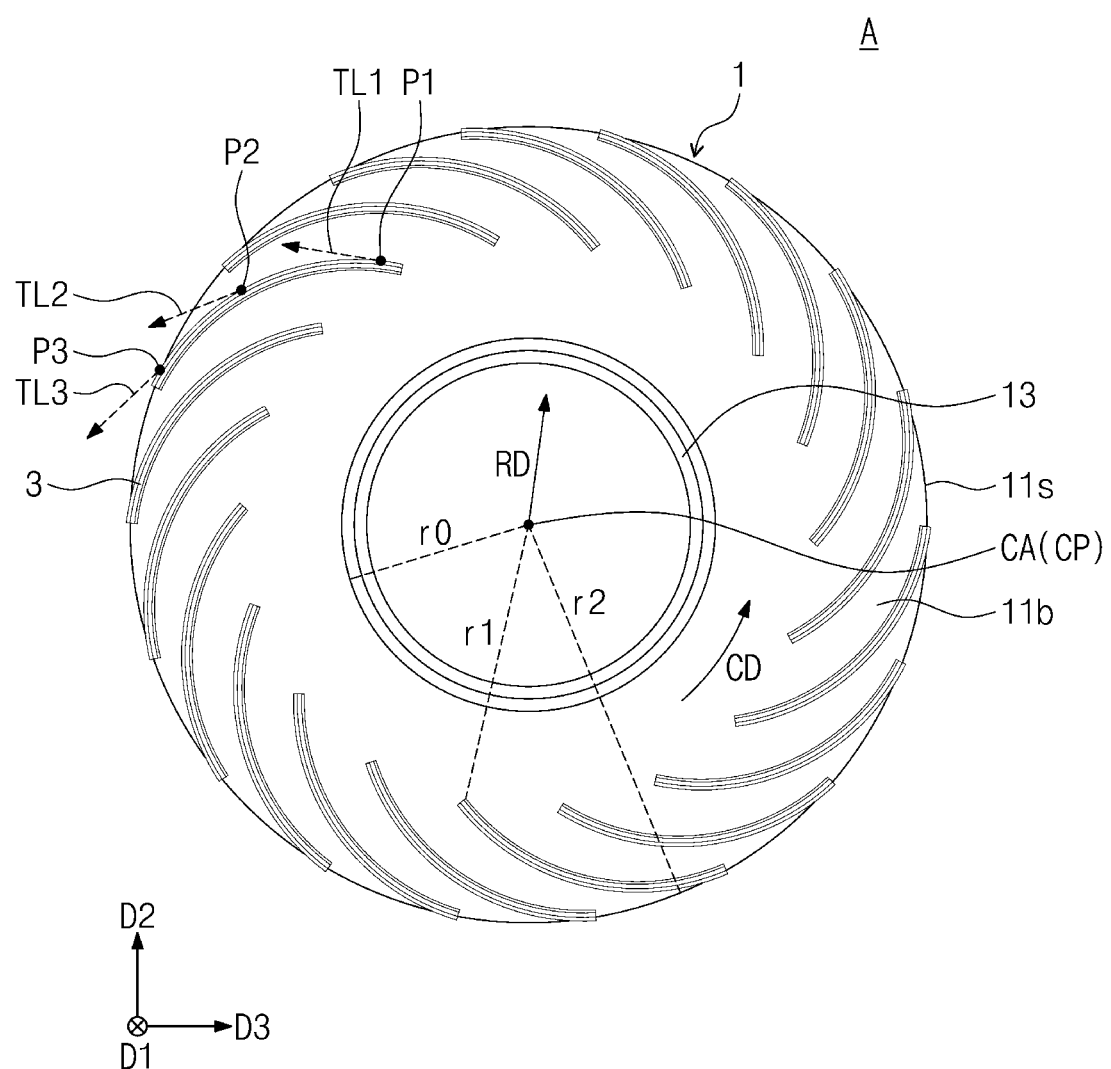
FIG. 6 is a bottom view illustrating an apparatus for cleaning a bowl, according to some embodiments of the inventive concepts.

FIG. 6 is a bottom view illustrating an apparatus for cleaning a bowl, according to some embodiments of the inventive concepts.

Referring to FIG. 6, a radius of the support region 13 may be a zeroth distance r0. For example, the support region 13 may be a ring shape or a disc shape. A radius of the guide region 11 may be a second distance r2. For example, the base plate 1 may have a radius having the second distance r2. The blade 3 may extend in a radial direction RD. In the present specification, the term 'radial direction RD' may mean a direction receding from the center CP of the base plate 1 in a plan view. In certain embodiments, the blade 3 may extend in a direction having an acute angle with respect to the radial direction RD. For example, the blade 3 may extend in a curve and tangent lines of the curve in a plan view may have acute angles with respect to the radial direction RD. The blade 3 may extend from a position spaced apart from the central axis CA (or the center point CP) of the base plate 1 by a first distance r1 to a position spaced apart from the central axis CA of the base plate 1 by the second distance r2. The blade 3 may have a curved shape, e.g., when viewed in a plan view. For example, the blade 3 may extend in a curve. In this case, an extending direction of the blade 3 may have an angular direction (e.g., having an acute angle with respect to the radial direction RD) as well as the radial direction RD. It may be understood that when the blade 3 extends in a curve, directions of tangent lines at different points of the blade 3 may be different from each other when viewed in a plan view. For example, a gradient of a first tangent line TL1 corresponding to a tangent line at a first point P1 of the blade 3 may be different from a gradient of a second tangent line TL2 corresponding to a tangent line at a second point P2 of the blade 3. In addition, the gradient of the second tangent line TL2 may be different from a gradient of a third tangent line TL3 corresponding to a tangent line at a third point P3 of the blade 3. When the second point P2 exists between the first point P1 and the third point P3, the gradient of the second tangent line TL2 may have a value between the gradient of the first tangent line TL1 and the gradient of the third tangent line TL3. For example, the blade 3 may extend in the form of a curve continuously inclined in only one direction in a plan view. For example, the blade 3 may extend in a curve in a counterclockwise direction in the bottom view of FIG. 6. In the above embodiments, the blade 3 extends in a curve. However, embodiments of the inventive concepts are not limited thereto. In certain embodiments, the blade 3 may extend in a straight line in only the radial direction RD.

The bowl cleaning apparatus may include a plurality of blades 3. The plurality of blades 3 may be spaced apart from each other in a circumferential direction CD. In the present specification, the term 'circumferential direction CD' may mean a direction of a line connecting points at equal distances from the center CP of the base plate 1. However, a single blade 3 will be mainly described hereinafter for the purpose of ease and convenience in explanation.

Figure 7:
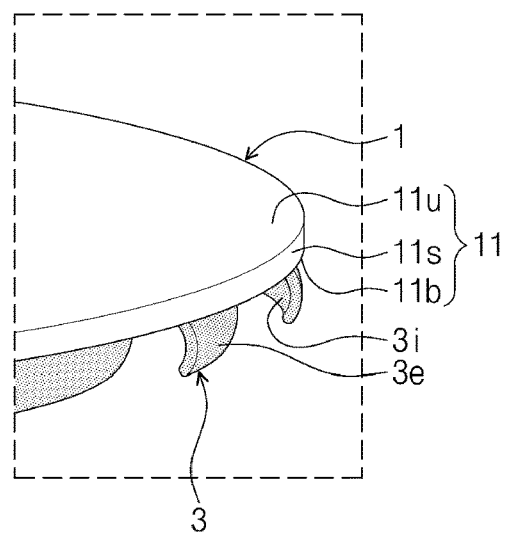
FIG. 7 is a perspective view illustrating a portion of an apparatus for cleaning a bowl, according to some embodiments of the inventive concepts.
Figure 8:
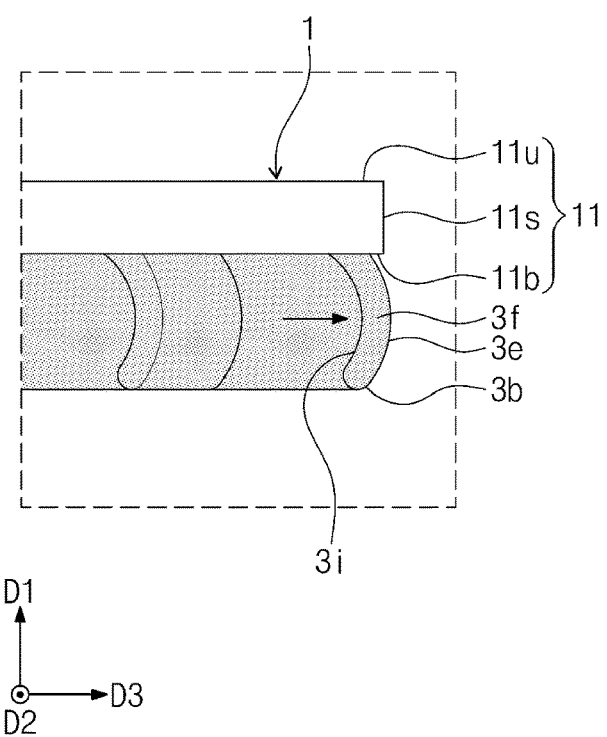
FIG. 8 is a side view illustrating a portion of an apparatus for cleaning a bowl, according to some embodiments of the inventive concepts.

FIG. 7 is a perspective view illustrating a portion of an apparatus for cleaning a bowl, according to some embodiments of the inventive concepts, and FIG. 8 is a cross-sectional view illustrating a portion of an apparatus for cleaning a bowl, according to some embodiments of the inventive concepts.

Referring to FIGS. 7 and 8, one side surface of the blade 3 may have a curved shape. For example, as illustrated in FIG. 8, an inner side surface 3i of the blade 3 may have a curved shape when viewed in a cross-sectional view taken along a direction perpendicular to the extending direction (e.g., a lengthwise direction) of the blade 3 at a certain point of the blade 3. The extending direction of the blade 3 may be an extending direction of a tangent line at a point of the blade 3 as described with reference to FIG. 6. The inner side surface 3i of the blade 3 may include or may be a curved surface concavely recessed toward the inside of the blade 3. The inner side surface 3i of the blade 3 may be the concavely curved surface at all points of the inner side surface 3i of the blade 3. However, embodiments of the inventive concepts are not limited thereto. In certain embodiments, the inner side surface 3i may have the concavely curved surface at only a portion of the inner side surface 3i of the blade 3. An outer side surface 3e of the blade 3 may include a curved surface convexly protruding toward the outside of the blade 3. The inner side surface 3i and the outer side surface 3e may be opposite to each other. A bottom surface 3b of the blade 3 may connect the inner side surface 3i and the outer side surface 3e. Thus, an entire shape of a cross section of the blade 3 may be an arc shape.

Figure 9:
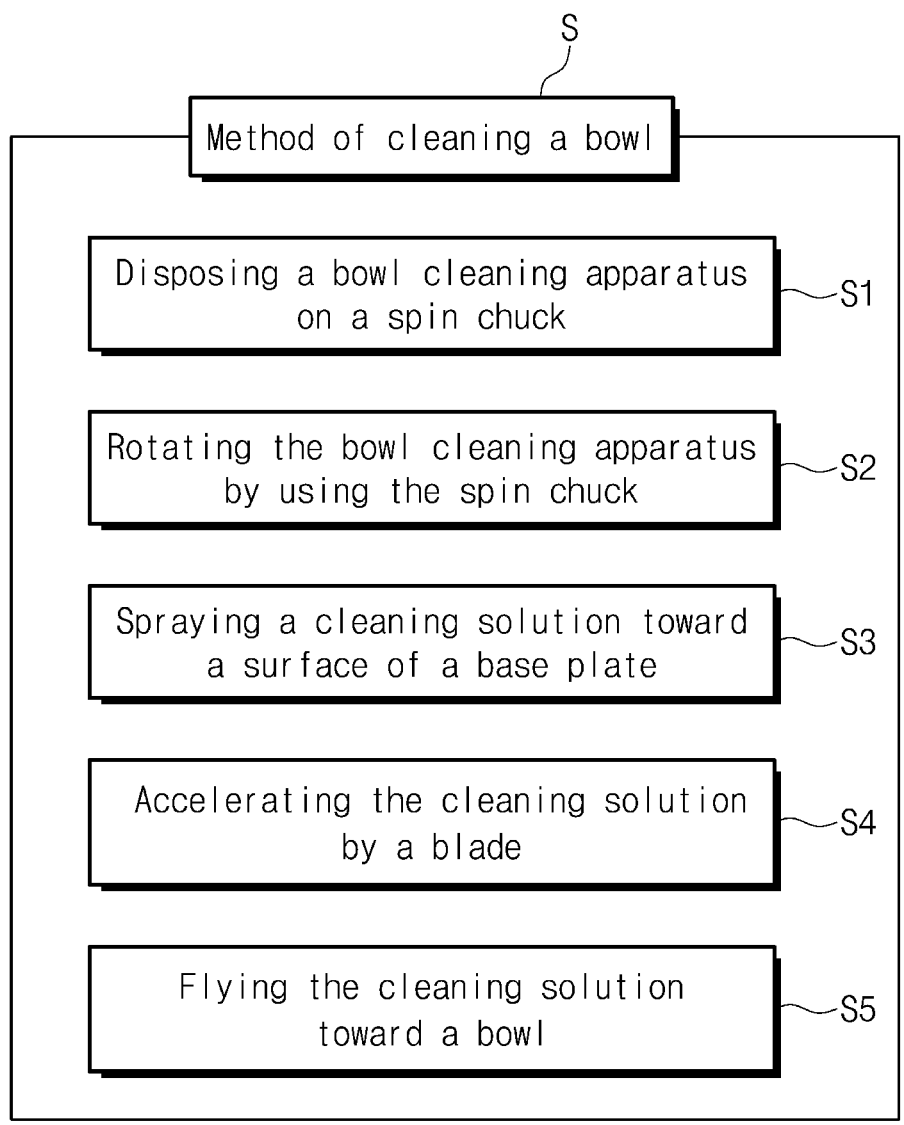
FIG. 9 is a flowchart illustrating a method of cleaning a bowl by using an apparatus for cleaning a bowl, according to some embodiments of the inventive concepts.

FIG. 9 is a flowchart illustrating a method of cleaning a bowl by using an apparatus for cleaning a bowl, according to some embodiments of the inventive concepts.

Referring to FIG. 9, a method S of cleaning a bowl may be provided. By the method S of cleaning a bowl, the bowl cleaning apparatus A (see FIG. 2) may be disposed on the spin chuck SC (see FIG. 2) to clean the bowl B (see FIG. 2). The method S of cleaning a bowl may include disposing a bowl cleaning apparatus on a spin chuck (S1), rotating the bowl cleaning apparatus by using the spin chuck (S2), spraying a cleaning solution toward a surface of a base plate (S3), accelerating the cleaning solution by a blade (S4), and flying the cleaning solution toward a bowl (S5).

Hereinafter, the steps of the method S of cleaning a bowl will be described in detail with reference to FIGS. 10 to 13.

Figure 10:
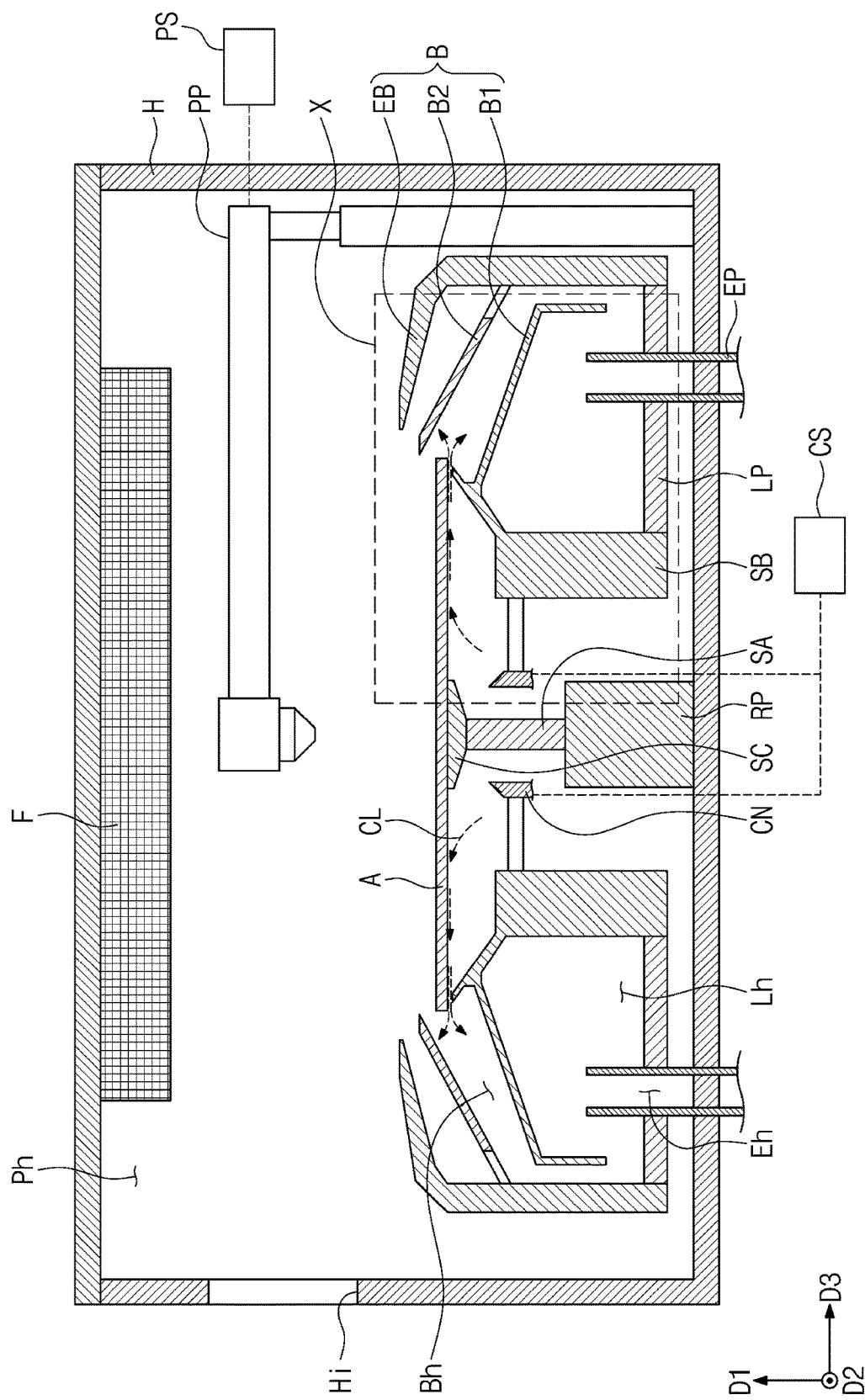
FIG. 10 is a cross-sectional view illustrating the method of cleaning a bowl in the flowchart of FIG. 9.

FIG. 10 is a cross-sectional view illustrating the method of cleaning a bowl in the flowchart of FIG. 9.

Referring to FIGS. 10 and 9, the disposing of the bowl cleaning apparatus on the spin chuck (S1) may include disposing the bowl cleaning apparatus A on an empty spin chuck SC. By the transfer unit, the bowl cleaning apparatus A may pass through the inlet Hi and then may be provided into the housing H. Before the disposing of the bowl cleaning apparatus A on the spin chuck SC, the transfer unit may remove the wafer W (see FIG. 1) from the spin chuck SC. The transfer unit may unload the wafer W from the spin chuck SC and move to the outside of the housing H through the inlet Hi. When the bowl cleaning apparatus A is disposed on the spin chuck SC, the spin chuck SC may fix the bowl cleaning apparatus A on the spin chuck SC. For example, the spin chuck SC may fix the bowl cleaning apparatus A on the spin chuck SC by using vacuum pressure.

The rotating of the bowl cleaning apparatus by using the spin chuck (S2) may include rotating the spin chuck SC by the rotation driving unit RP. The rotation driving force may be transmitted to the spin chuck SC through the rotation shaft SA, and thus the spin chuck SC may rotate about an axis parallel to the first direction Dl1 Since the spin chuck SC adsorbs and fixes the bowl cleaning apparatus A, the bowl cleaning apparatus A may also rotate about the axis parallel to the first direction D1.

Figure 11:
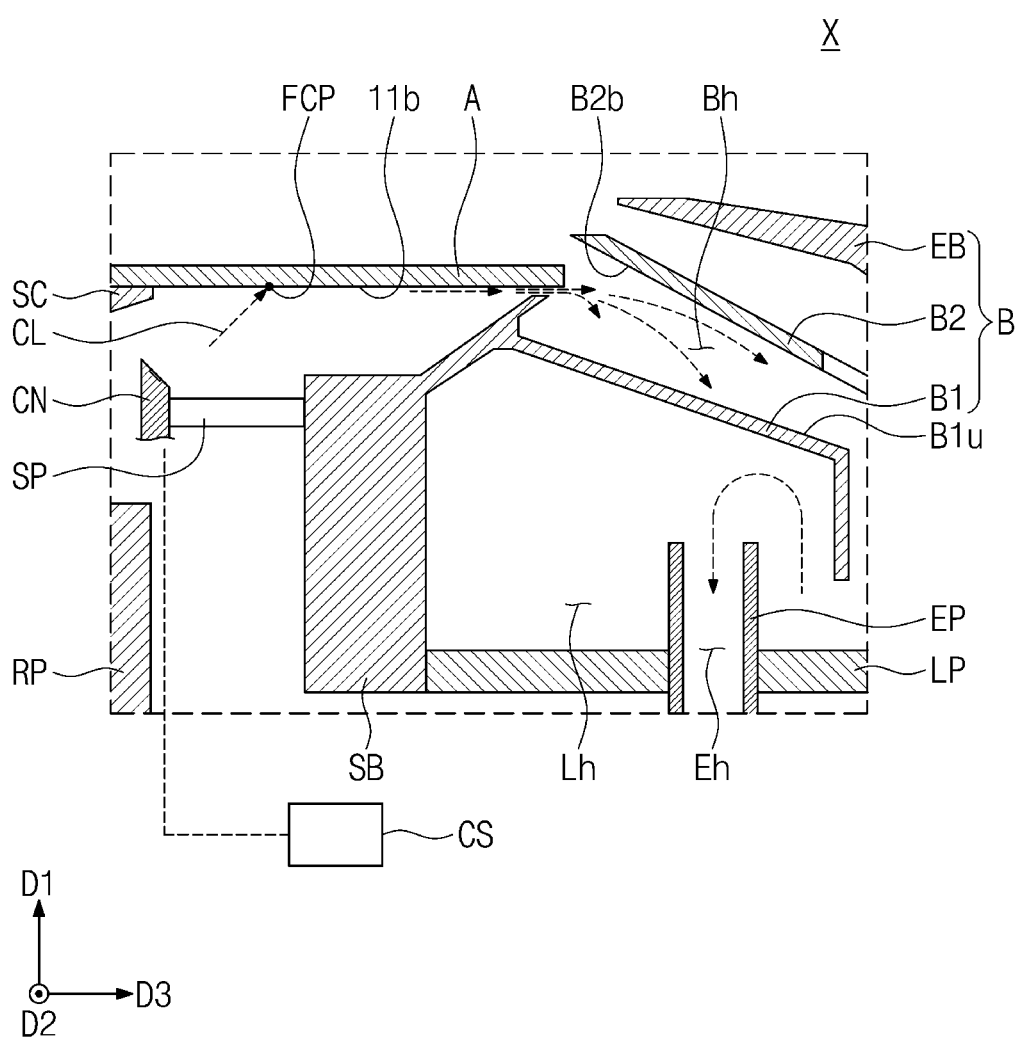
FIG. 11 is an enlarged cross-sectional view of a region 'X' of FIG. 10.

FIG. 11 is an enlarged cross-sectional view of a region 'X' of FIG. 10.

Referring to FIGS. 11 and 9, the spraying of the cleaning solution toward the surface of the base plate (S3) may include spraying a cleaning solution CL toward the bottom surface 11b of the base plate 1 by the cleaning solution spraying apparatus CN. The cleaning solution CL may be sprayed to form an acute angle with the bottom surface 11b. For example, the cleaning solution CL may be sprayed in an inclined direction with respect to the bottom surface 11b of the base plate 1. For example, a trajectory of the cleaning solution CL may form the acute angle with the bottom surface 11b at a point FCP where the cleaning solution CL comes in first contact with the bottom surface 11b.

Figure 12:
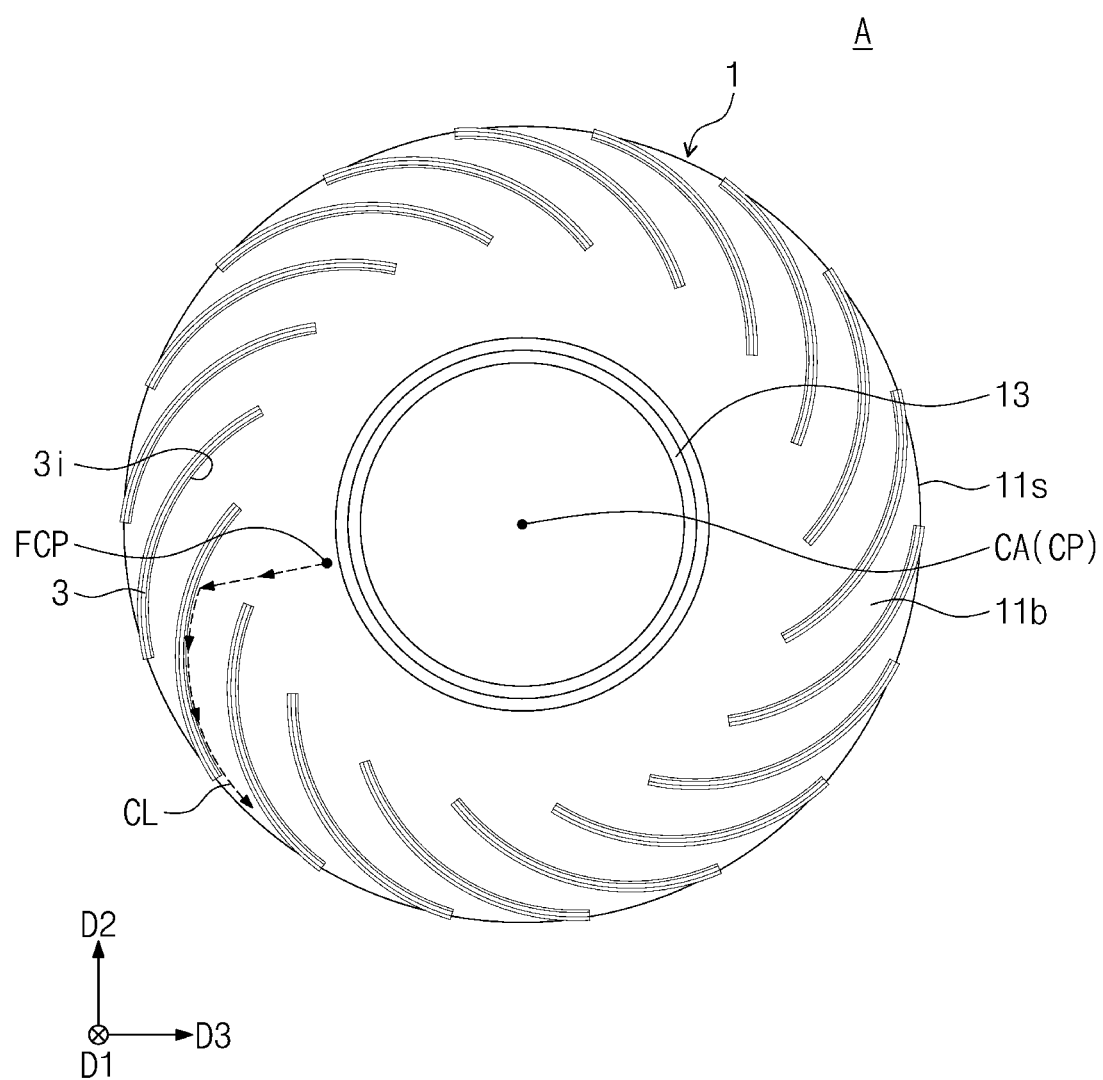
FIG. 12 is a bottom view illustrating the method of cleaning a bowl in the flowchart of FIG. 9.
Figure 13:
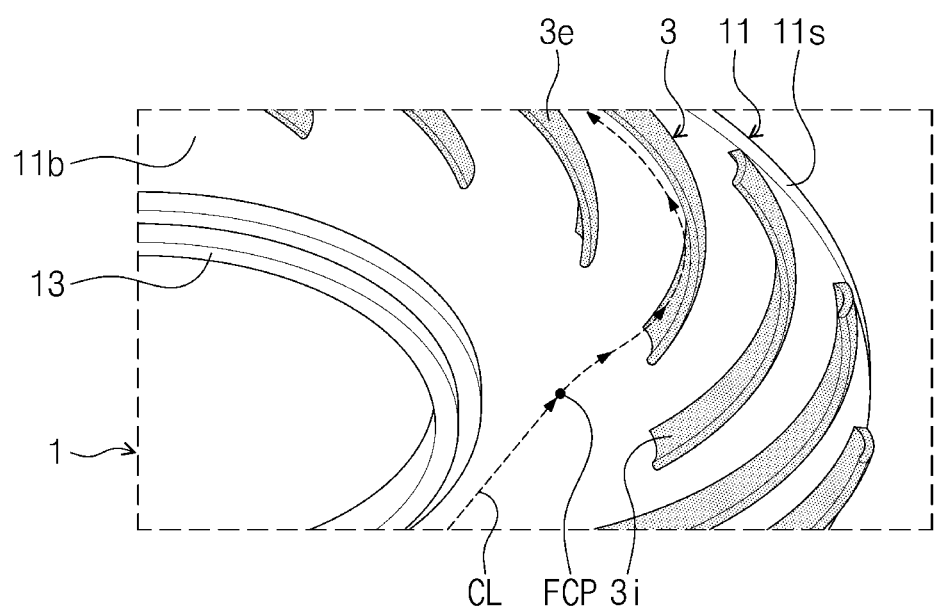
FIG. 13 is a perspective view illustrating the method of cleaning a bowl in the flowchart of FIG. 9.

FIG. 12 is a bottom view illustrating the method of cleaning a bowl in the flowchart of FIG. 9, and FIG. 13 is a perspective view illustrating the method of cleaning a bowl in the flowchart of FIG. 9.

Referring to FIGS. 12, 13 and 9, the accelerating of the cleaning solution by the blade (S4) may include accelerating the cleaning solution CL by rotation of the blade 3. The cleaning solution CL may move in the radial direction from the point FCP where the cleaning solution CL comes in first contact with the bottom surface 11b. For example, the cleaning solution CL may temporarily adhere to the bottom surface 11b by adhesive force between the bottom surface 11b and the cleaning solution CL. Since the bottom surface 11b rotates, the cleaning solution CL may also receive rotational force. When the cleaning solution CL receives the rotational force, centrifugal force may be generated at the cleaning solution CL. Thus, the cleaning solution CL may move in the direction receding from the center CP of the base plate 1, which corresponds to a rotation center (a center of rotation). For example, the cleaning solution CL may move in the radial direction on the bottom surface 11b by the centrifugal force. When the cleaning solution CL moving in the radial direction while being in contact with the blade 3, the cleaning solution CL may receive force by the inner side surface 3i of the blade 3. Thus, the cleaning solution CL may move along the inner side surface 3i of the blade 3. The cleaning solution CL may be accelerated by the inner side surface 3i of the blade 3. Thus, a speed of the cleaning solution CL may be increased. As a result, the cleaning solution CL may have a high speed at an end of the blade 3.

Referring again to FIGS. 11 and 9, in the step of flying of the cleaning solution toward the bowl (S5), the cleaning solution CL may move along the bottom surface 11b of the bowl cleaning apparatus A and then may be provided into the bowl path Bh. The cleaning solution CL may come in contact with the top surface B1u of the first bowl B1. The cleaning solution CL may clean the top surface Blu of the first bowl B1. For example, the cleaning solution CL may remove the photoresist remaining on the top surface B1u of the first bowl B1. The cleaning solution CL may clean the bottom surface B2b of the second bowl B2. For example, the cleaning solution CL may remove the photoresist remaining on the bottom surface B2b of the second bowl B2. The cleaning solution CL may pass through the bowl path Bh and then may be exhausted to the outside of the housing H through the exhaust path Eh.

According to the bowl cleaning apparatus and the PR coating system including the same in the embodiments of the inventive concepts, the cleaning solution may be accelerated by the blade to increase the speed of the cleaning solution leaving the bowl cleaning apparatus. Thus, the high-speed cleaning solution may collide with the bowl to effectively remove the photoresist remaining on the surface of the bowl. Even though the photoresist has a high viscosity, the photoresist may be effectively cleaned/removed from the bowl.

According to the bowl cleaning apparatus and the PR coating system including the same in the embodiments of the inventive concepts, since the inner side surface of the blade is concavely recessed, it is possible to prevent the cleaning solution from dripping down even though a rotation speed of the bowl cleaning apparatus is high. For example, since the cleaning solution is accelerated while being collected in the concave inner side surface, separation of the cleaning solution from the blade 3 and/or the bottom surface 11b of the bowl cleaning apparatus A may be prevented even though the bowl cleaning apparatus A rotates at a high speed. Thus, the bowl cleaning apparatus A may rotate at a high RPM. For example, the rotation speed may be increased to about 5000 RPM. Thus, the speed of the cleaning solution may be more increased. As the speed of the cleaning solution increases, cleaning ability to the bowl may be improved. In addition, it is possible to save wasted cleaning solution falling from the base plate. For example, the high rotation speed of the bowl cleaning apparatus A may be beneficial to reduce falling of the cleaning solution CL from the base plate 1 of the bowl cleaning apparatus A, and the high speed of the cleaning solution CL may be beneficial for reducing the cleaning solution usage due to the increased cleaning ability of the high speed cleaning solution.

According to the bowl cleaning apparatus and the PR coating system including the same in the embodiments of the inventive concepts, a replacement period of the bowl may be increased by the improved cleaning ability to the bowl. Thus, process continuity may be secured, and waste of the bowl may be prevented/reduced.

Figure 14:
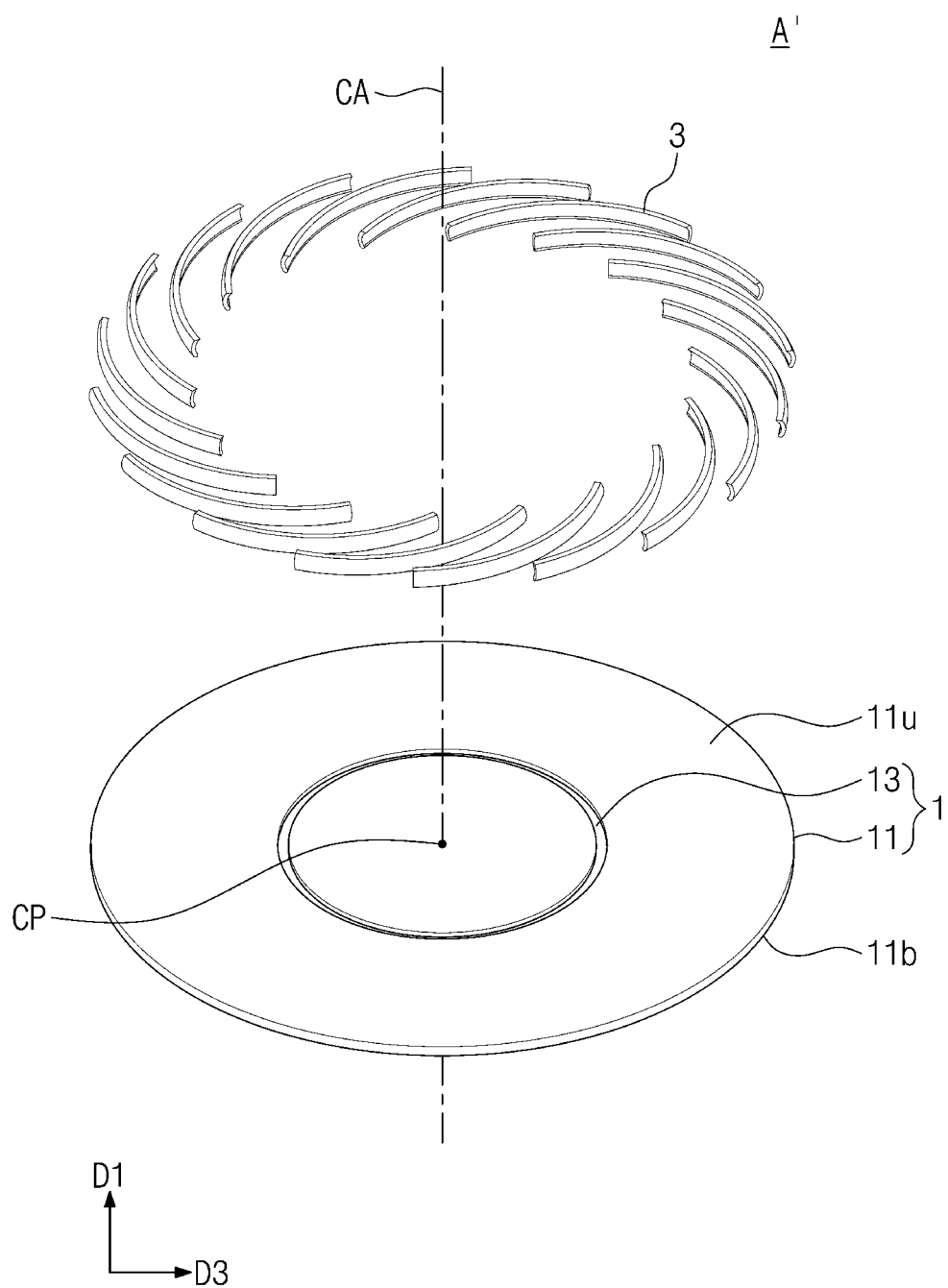
FIG. 14 is an exploded perspective view illustrating an apparatus for cleaning a bowl, according to some embodiments of the inventive concepts.

FIG. 14 is an exploded perspective view illustrating an apparatus for cleaning a bowl, according to some embodiments of the inventive concepts.

Hereinafter, the descriptions to the same/similar features as mentioned with reference to FIGS. 1 to 13 will be omitted for the purpose of ease and convenience in explanation.

Referring to FIG. 14, a bowl cleaning apparatus A' may include a base plate 1 and a blade 3. However, unlike the embodiments described with reference to FIG. 4, the blade 3 may be coupled to the top surface 11u of the base plate 1. For example, the blade 3 may be attached on and/or contact the top surface 11u of the base plate 1.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Figure 15:
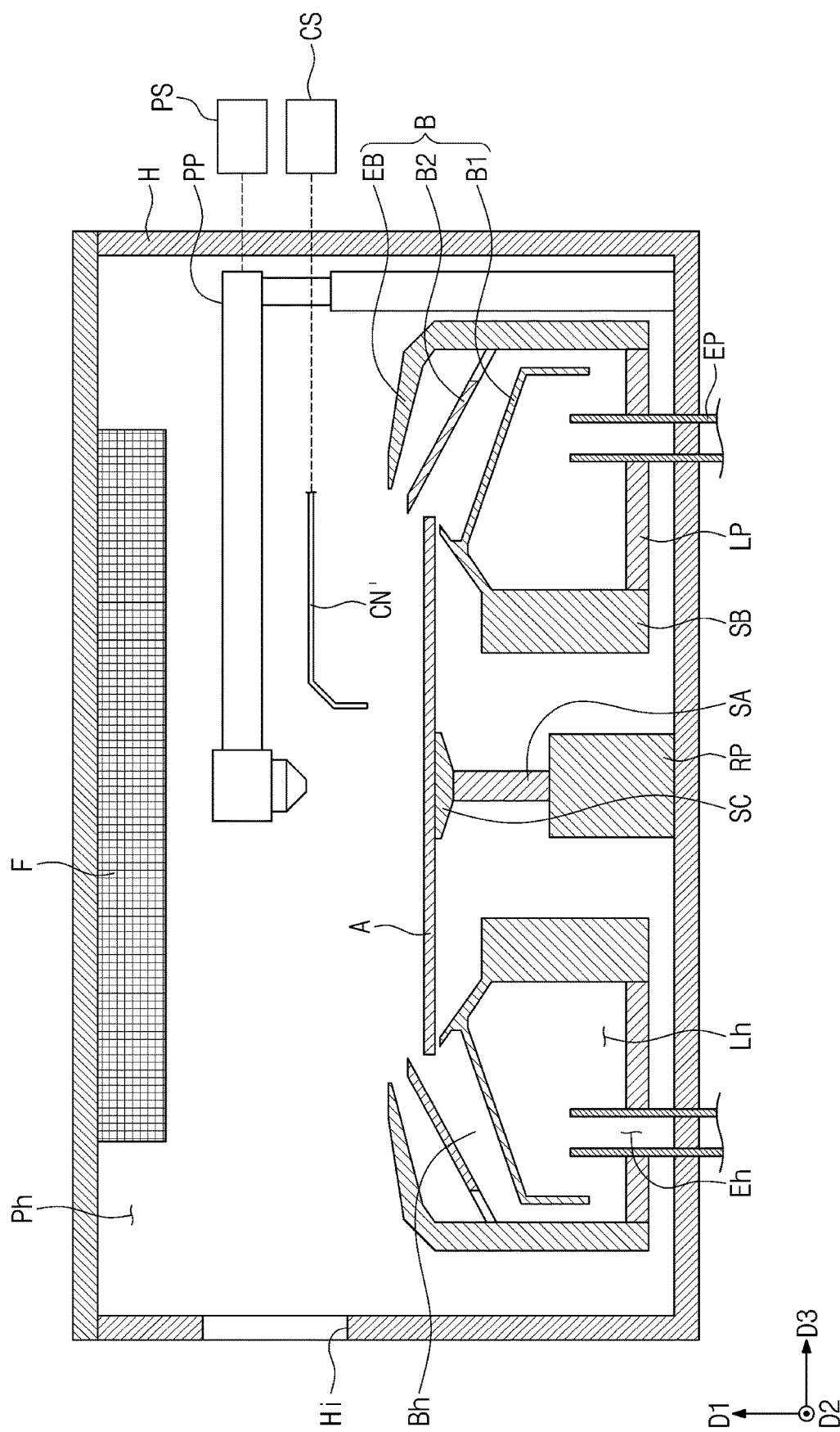
FIG. 15 is a cross-sectional view illustrating a PR coating system according to some embodiments of the inventive concepts.

FIG. 15 is a cross-sectional view illustrating a PR coating system according to some embodiments of the inventive concepts.

Hereinafter, the descriptions to the same/similar features as mentioned with reference to FIGS. 1 to 14 will be omitted for the purpose of ease and convenience in explanation.

Referring to FIG. 15, a cleaning solution spraying apparatus CN' may be located above the spin chuck SC. For example, the cleaning solution spraying apparatus CN' may be spaced apart upwardly from the spin chuck SC to spray the cleaning solution down toward the spin chuck SC. Thus, when the bowl cleaning apparatus A is disposed on the spin chuck SC, the cleaning solution may be sprayed toward a top surface of the bowl cleaning apparatus A. When the blade 3 is coupled to and/or attached on the top surface of the base plate 1 like the embodiment illustrated in FIG. 14, the cleaning solution sprayed toward the top surface of the base plate 1 may be accelerated by the blade 3.

Figure 16:
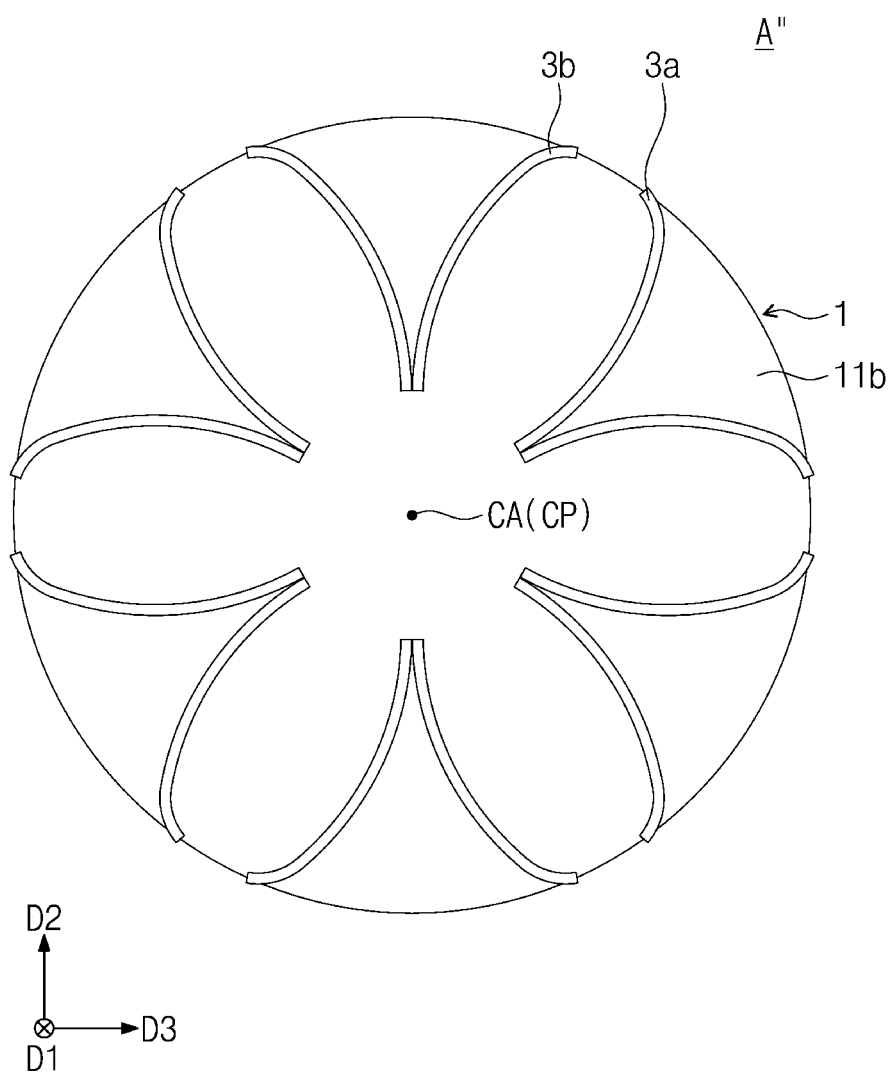
FIG. 16 is a bottom view illustrating an apparatus for cleaning a bowl, according to some embodiments of the inventive concepts.

FIG. 16 is a bottom view illustrating an apparatus for cleaning a bowl, according to some embodiments of the inventive concepts.

Hereinafter, the descriptions to the same/similar features as mentioned with reference to FIGS. 1 to 15 will be omitted for the purpose of ease and convenience in explanation.

Referring to FIG. 16, a bowl cleaning apparatus A" may include a first blade 3a and a second blade 3b. The first blade 3a may be coupled to the bottom surface 11b of the base plate 1. For example, the first blade 3a may be attached on and/or contact the bottom surface 11b of the base plate 1. The first blade 3a may extend in a direction receding from the center CP of the base plate 1. For example, the first blade 3a may extend in a curve in a clockwise direction when viewed in a plan view. The second blade 3b may be coupled to the bottom surface 11b of the base plate 1. For example, the second blade 3b may be attached on and/or contact the bottom surface 11b of the base plate 1. The second blade 3b may extend in the direction receding from the center CP of the base plate 1. For example, the second blade 3b may extend in a curve in a counterclockwise direction when viewed in a plan view. The first blade 3a and the second blade 3b may be spaced apart from each other in the circumferential direction of the base plate 1 and may constitute a blade pair. The bowl cleaning apparatus A may include a plurality of blade pairs. The plurality of blade pairs may be spaced apart from each other in the circumferential direction.

The bowl cleaning apparatus and the PR coating system including the same in the present embodiments of the inventive concepts may include both the blade extending in a curve in the clockwise direction and the blade extending in a curve in the counterclockwise direction. Thus, no matter which direction the spin chuck rotates, the bowl may be cleaned using a single bowl cleaning apparatus.

Figure 17:
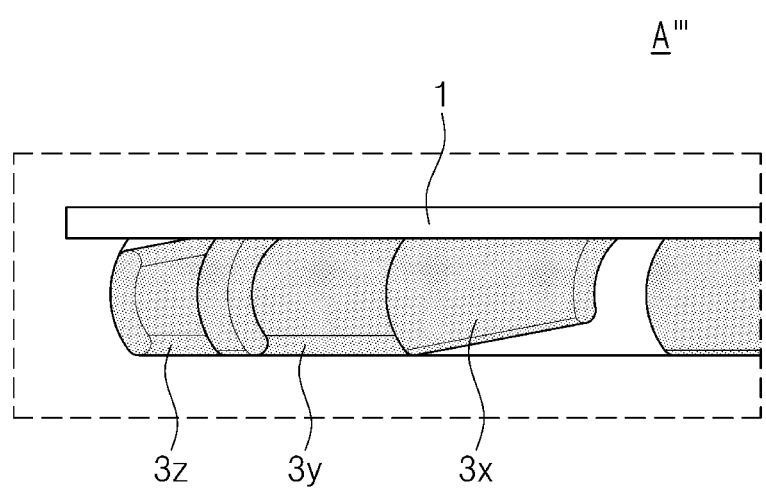
FIG. 17 is a side view illustrating a portion of an apparatus for cleaning a bowl, according to some embodiments of the inventive concepts.

FIG. 17 is a side view illustrating a portion of an apparatus for cleaning a bowl, according to some embodiments of the inventive concepts.

Hereinafter, the descriptions to the same/similar features as mentioned with reference to FIGS. 1 to 16 will be omitted for the purpose of ease and convenience in explanation.

Referring to FIG. 17, a bowl cleaning apparatus A+" may include a base plate 1, an upwardly inclined blade 3x, a normal blade 3y, and a downwardly inclined blade 3z.

The base plate 1 may be the same as, substantially the same as or similar to the base plate described with reference to FIG. 4.

The upwardly inclined blade 3x may be coupled to and/or attached on a surface of the base plate 1. A thickness of the upwardly inclined blade 3x may become less from the inside toward the outside of the base plate 1. For example, the thickness of the upwardly inclined blade 3x may decrease in a direction receding from the center of the base plate 1. The upwardly inclined blade 3x may rise upward from the inside toward the outside of the base plate 1. Thus, the cleaning solution moving along an inner side surface of the upwardly inclined blade 3x may rise upward toward the outside of the base plate 1. When the cleaning solution exits to the outside of the upwardly inclined blade 3x, the cleaning solution may have a certain angle toward an upper side. For example, the cleaning solution may fly in an upwardly inclined state when flying to the outside of the base plate 1. For example, the cleaning solution may fly in an upwardly inclined direction with respect to a horizontal plane when the cleaning solution leaves from the upwardly inclined blade 3x.

The normal blade 3y may be the same as, substantially the same as or similar to the blade described with reference to FIG. 4.

A thickness of the downwardly inclined blade 3z may become less from the inside toward the outside of the base plate 1. For example, the thickness of the downwardly inclined blade 3z may decrease in a direction toward the center of the base plate 1. The downwardly inclined blade 3z may descend from the inside toward the outside of the base plate 1. Thus, the cleaning solution moving along an inner side surface of the downwardly inclined blade 3z may descend toward the outside of the base plate 1. When the cleaning solution exits to the outside of the downwardly inclined blade 3z, the cleaning solution may have a certain angle toward a lower side. For example, the cleaning solution may fly in a downwardly inclined state when flying to the outside of the base plate 1. For example, the cleaning solution may fly in a downwardly inclined direction with respect to a horizontal plane when the cleaning solution leaves from the downwardly inclined blade 3z.

According to the bowl cleaning apparatus and the PR coating system including the same in the present embodiments of the inventive concepts, the bowl cleaning apparatus may include blades bent in various directions. The cleaning solution flying to the outside of the bowl cleaning apparatus may fly at various angles. Thus, the cleaning solution may reach various points of the surface of the bowl. As a result, the bowl may be efficiently cleaned.

According to the bowl cleaning apparatus and the PR coating system including the same in the embodiments of the inventive concepts, the bowl may be effectively cleaned.

According to the bowl cleaning apparatus and the PR coating system including the same in the embodiments of the inventive concepts, the replacement period of the bowl may be increased.

According to the bowl cleaning apparatus and the PR coating system including the same in the embodiments of the inventive concepts, the bowl may be cleaned by various methods.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. An apparatus for cleaning a bowl, the apparatus comprising:
    a base plate; and
    a blade coupled to the base plate,
    wherein the blade comprises:
        a first blade extending on a surface of the base plate in a direction receding from a center of the base plate along a curve in a clockwise direction in a plan view; and
        a second blade extending on the surface of the base plate in a direction receding from the center of the base plate along a curve in a counterclockwise direction in the plan view; and
    wherein an inner side surface of the first blade includes a curved surface concavely recessed toward an inside of the first blade in a cross-sectional view taken perpendicular to an extending direction of the first blade.

2. The apparatus of claim 1, wherein the apparatus comprises a plurality of blades, and
    wherein the plurality of blades are spaced apart from each other in a circumferential direction of the base plate.

3. The apparatus of claim 1, wherein the first and second blades are coupled to a bottom surface of the base plate.

4. The apparatus of claim 3, further comprising:
    a lower plate coupled to bottom surfaces of the first and second blade and vertically spaced apart from the base plate.

5. The apparatus of claim 4, wherein the lower plate has a ring shape, and
    wherein the first and second blades are located at a position spaced apart from the center of the base plate in the plan view.

6. The apparatus of claim 1, wherein the first and second blades are coupled to a top surface of the base plate.

7. The apparatus of claim 1, wherein an outer side surface of the first blade includes a curved surface convexly protruding toward an outside of the first blade in the cross-sectional view taken perpendicular to the extending direction of the first blade, and
    wherein the inner side surface and the outer side surface are opposite to each other.

8. A photoresist (PR) coating system comprising:
    a bowl having a ring shape;
    a spin chuck located inside the bowl and configured to rotate about an axis parallel to a first direction;
    a bowl cleaning apparatus configured to be disposed on the spin chuck and configured to be rotated by the spin chuck; and
    a cleaning solution spraying apparatus configured to spray a cleaning solution toward the bowl cleaning apparatus,
    wherein the bowl cleaning apparatus comprises:
        a base plate having a central axis parallel to the first direction when the bowl cleaning apparatus is disposed on the spin chuck; and
        a first blade and a second blade extending on a surface of the base plate in respective curved directions receding from a center of the base plate in a plan view,
    wherein outer ends of the first blade and the s and blade are disposed to face each other; and
    wherein an inner surface of the first blade includes a curved surface concavely recessed toward an inside of the first blade in a cross-sectional view taken perpendicular to an extending direction of the first blade.

9. The PR coating system of claim 8, wherein the first blade extends in a clockwise direction in the plan view and the second blade extends in a counter clockwise direction in the plan view.

10. The PR coating system of claim 8, wherein the bowl cleaning apparatus comprises a plurality of blades, and
    wherein the plurality of blades are spaced apart from each other in a circumferential direction of the base plate.

11. The PR coating system of claim 8, wherein the base plate includes:
    a support region through which the central axis passes; and
    a guide region provided outside the support region,
    wherein the first and second blades are located on a surface of the guide region.

12. The PR coating system of claim 11, wherein the first and second blades are coupled to a bottom surface of the base plate, and
    wherein the bowl cleaning apparatus further comprises: a lower plate coupled to bottom surfaces of the first and second blades and spaced apart downwardly from the base plate.

13. The PR coating system of claim 12, further comprising:
    a transfer unit configured to transfer a wafer onto the spin chuck,
    wherein the transfer unit is configured to come in contact with the lower plate to transfer the bowl cleaning apparatus onto the spin chuck.

14. The PR coating system of claim 12, wherein the cleaning solution spraying apparatus is located under the spin chuck to spray the cleaning solution to the bottom surface of the base plate.

15. The PR coating system of claim 8, wherein the first and second blades are coupled to a top surface of the base plate, and
    wherein the cleaning solution spraying apparatus is located above the spin chuck to spray the cleaning solution to the top surface of the base plate.

16. The PR coating system of claim 8, wherein the bowl comprises:
    a first bowl configured to be located below the bowl cleaning apparatus in a state in which the bowl cleaning apparatus is disposed on the spin chuck; and
    a second bowl spaced apart outwardly from the first bowl and surrounding the first bowl.

17. The PR coating system of claim 8, wherein the base plate includes a support region through which the central axis passes, and wherein a largest radius of the support region is smaller than a distance between the central axis and a portion of the first blade that is closest to the central axis.

18. An apparatus for cleaning a bowl, the apparatus comprising:
a base plate having a disk shape; and
a plurality of blades including a first group of blades and a second group of blades, wherein the plurality of blades are coupled to the base plate,
wherein each of the plurality of blades extends in a curve on a surface of the base plate from a position spaced apart from a central axis of the base plate by a first distance to a position spaced apart from the central axis by a second distance greater than the first distance in a plan view,
wherein the first group of blades extends on the surface of the base plate in a direction receding from enter of the base plate along a curve in a clockwise direction in a plan view, and the second group of blades extends on the surface of the base plate in a direction receding from the center of the base plate along a curve in a counterclockwise direction in the plan view, and
wherein the plurality of blades are spaced apart from each other in a circumferential direction of the base plate.

19. The apparatus of claim 18, wherein the plurality of blades are coupled to a bottom surface of the base plate, the apparatus further comprising:
a lower plate coupled to bottoms of the plurality of blades and vertically spaced apart from the base plate,
wherein the lower plate has a ring shape.

* * * * *